(12) United States Patent
Fujimoto

(10) Patent No.: US 7,084,614 B2
(45) Date of Patent: Aug. 1, 2006

(54) REFERENCE VOLTAGE GENERATOR

(75) Inventor: Shuichiro Fujimoto, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 306 days.

(21) Appl. No.: 10/798,358

(22) Filed: Mar. 12, 2004

(65) Prior Publication Data
US 2005/0001604 A1    Jan. 6, 2005

(30) Foreign Application Priority Data
Jul. 4, 2003    (JP) ............................ 2003-270955

(51) Int. Cl.
*G05F 3/16* (2006.01)
(52) U.S. Cl. .................................... 323/313
(58) Field of Classification Search ............... 323/313, 323/314
See application file for complete search history.

(56) References Cited

U.S. PATENT DOCUMENTS

| | | | | |
|---|---|---|---|---|
| 5,923,211 A | * | 7/1999 | Maley et al. | 327/540 |
| 6,031,413 A | * | 2/2000 | Mizoguchi | 327/538 |
| 6,236,273 B1 | * | 5/2001 | Lewyn | 330/297 |
| 6,392,392 B1 | * | 5/2002 | Nakahara | 323/312 |

FOREIGN PATENT DOCUMENTS

JP    09-101831    4/1997

* cited by examiner

*Primary Examiner*—Jeffrey Sterrett
(74) *Attorney, Agent, or Firm*—Nixon Peabody LLP; Donald R. Studebaker

(57) ABSTRACT

There is provided a reference voltage generator capable of restricting current consumption without increasing a pattern area of an integrated circuit. The present invention relates to a reference voltage generator for generating bias reference voltages in a semiconductor integrated circuit connected to first and fourth potentials to operate, which comprises first through fifth transistors and a current-limiting resistor.

4 Claims, 4 Drawing Sheets

REFERENCE VOLTAGE GENERATOR

BACKGROUND OF THE INVENTION

1. Field of the Invention

The present invention relates to a reference voltage generator for generating bias reference voltages in a semiconductor integrated circuit.

2. Description of the Related Art

FIG. 1 is a circuit diagram showing a conventional reference voltage generator.

The reference voltage generator has a P channel MOS transistor (hereinafter called "PMOS") 1 that generates a constant voltage. The source of the PMOS1 is connected to a potential VDD and the gate and drain thereof are connected to a node N1. The node N1 is connected to a potential VEE through a current-limiting resistor 2. A first reference voltage VREF1 is outputted from the node N1. Further, the gate of a PMOS3 that constitutes a current mirror circuit with respect to the PMOS1 is connected to the node N1.

The source of the PMOS3 is connected to the potential VDD and the drain thereof is connected to a node N2, respectively. An N channel MOS transistor (hereinafter called "NMOS") 4 diode-connected in a forward direction is connected between the node N2 and the potential VEE. A second reference voltage VREF2 is outputted from the node N2.

In this type of reference voltage generator, a current flows from the potential VDD to the potential VEE via the PMOS1 and the resistor 2. At this time, the voltage between the source and drain of the PMOS1 results in a threshold voltage Vtp of the PMOS1 regardless of the flowing current. Accordingly, the reference voltage VREF1 outputted to the node N1 results in a constant voltage reduced by the threshold voltage Vtp from the potential VDD.

On the other hand, a current proportional to the current of the PMOS1 flows into the PMOS3 that constitutes the current mirror circuit. The current of the PMOS3 flows toward the potential VEE via an NMOS4. At this time, the voltage developed between the drain and source of the NMOS4 results in a threshold voltage Vtn of the NMOS4 regardless of the flowing current. Accordingly, the reference voltage VREF2 outputted to the node N2 is brought to a constant voltage set high or increased by the threshold voltage Vtn from the potential VEE. Thus, the current-limiting resistor 2 restricts the reference current that flows through each of the PMOS1, PMOS3 and NMOS4, and the two types of reference voltages VREF1 and VREF2 can be generated with small current consumption.

However, when the difference between the potentials VDD and VEE is large, there is a need to increase the value of the resistor 2 in order to suppress the reference current, and hence a pattern area of an integrated circuit will increase.

Assuming that the reference current is set to 1 µA when VDD=+15V and VEE=−15V, for example, the value of the resistor 2 results in 30MΩ. Assuming that a W/L (=gate width/gate length) of the PMOS1 is 20 µm/7 µm, a W/L of the PMOS3 is 400 µm/7 µm and a W/L of the NMOS4 is 200 µm/7 µm, respectively, a region for the resistor 2 becomes 200 µm×200 µm=40,000 µm$^2$, and regions for the transistors 1, 3 and 4 become 200 µm×50 µm=10,000 µm$^2$, so that an approximate pattern area results in 50,000 µm$^2$ in total.

On the other hand, when the region for the resistor 2 is reduced, a large resistance value cannot be obtained and hence current consumption will increase.

SUMMARY OF THE INVENTION

There is provided a reference voltage generator capable of restricting current consumption without increasing a pattern area of an integrated circuit. The present invention relates to a reference voltage generator for generating bias reference voltages in a semiconductor integrated circuit connected to first and fourth potentials to operate, which comprises first through fifth transistors and a current-limiting resistor both set forth below. The first transistor has a source connected to a second potential between the first and fourth potentials and a gate and drain connected to a first node. One end of the resistor is connected to a third potential between the second and fourth potentials, whereas the other end thereof is connected to the first node. The second transistor has a source connected to the second potential, a gate connected to the first node and a drain connected to a second node. A first reference voltage is outputted to the second node. The third transistor has a drain and gate connected to the second node and a source connected to the fourth potential. The fourth transistor has a source connected to the fourth potential, a gate connected to the second node and a drain connected to a third node. A second reference voltage is outputted to third node. Further, the fifth transistor has a source connected to the first potential and a gate and drain connected to the third node.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
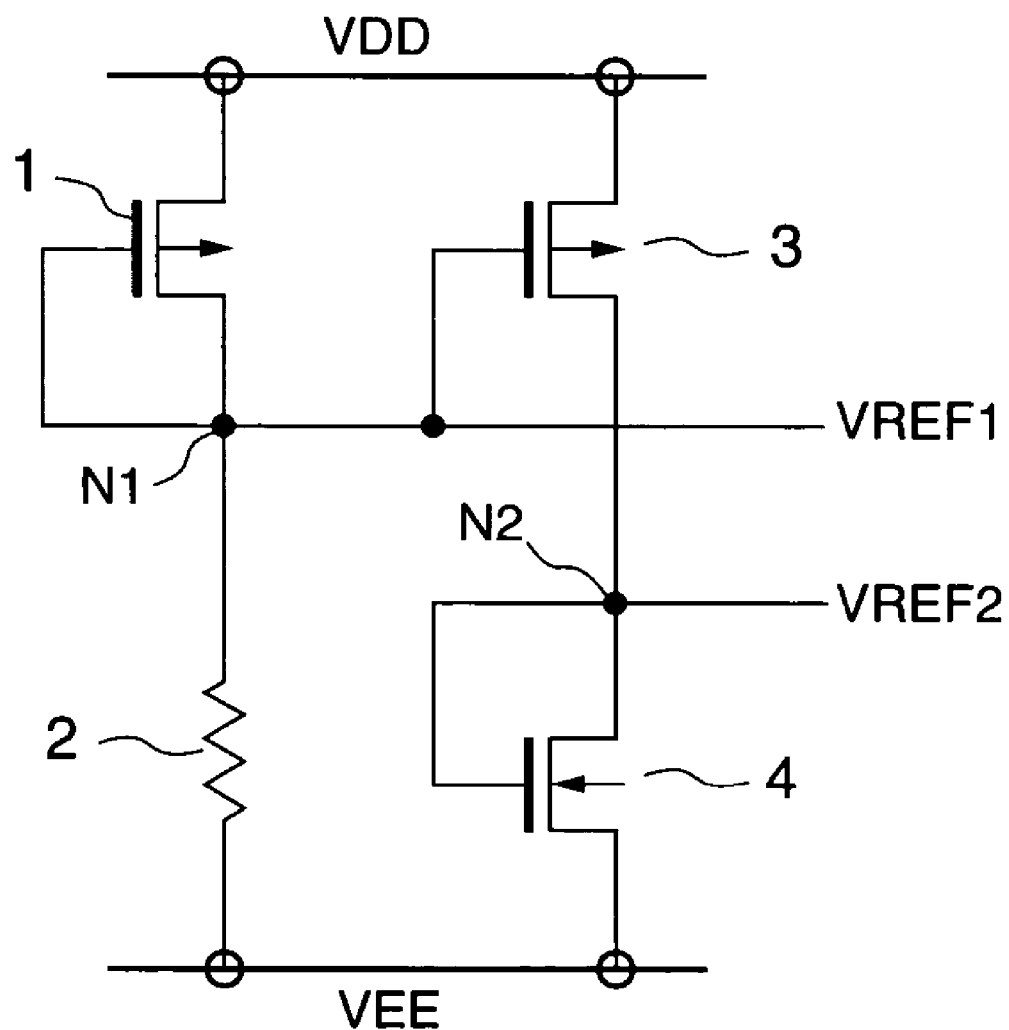
FIG. 1 is a circuit diagram showing a conventional reference voltage generator.

Preferred embodiments of the present invention will hereinafter be described in detail using the accompanying drawings. Incidentally, the sizes, shapes and layout relationship of respective constituent elements in the drawings are merely approximate illustrations to enable an understanding of the present invention. Further, numerical conditions explained below are nothing more than mere illustrations.

FIRST EMBODIMENT

Figure 2:
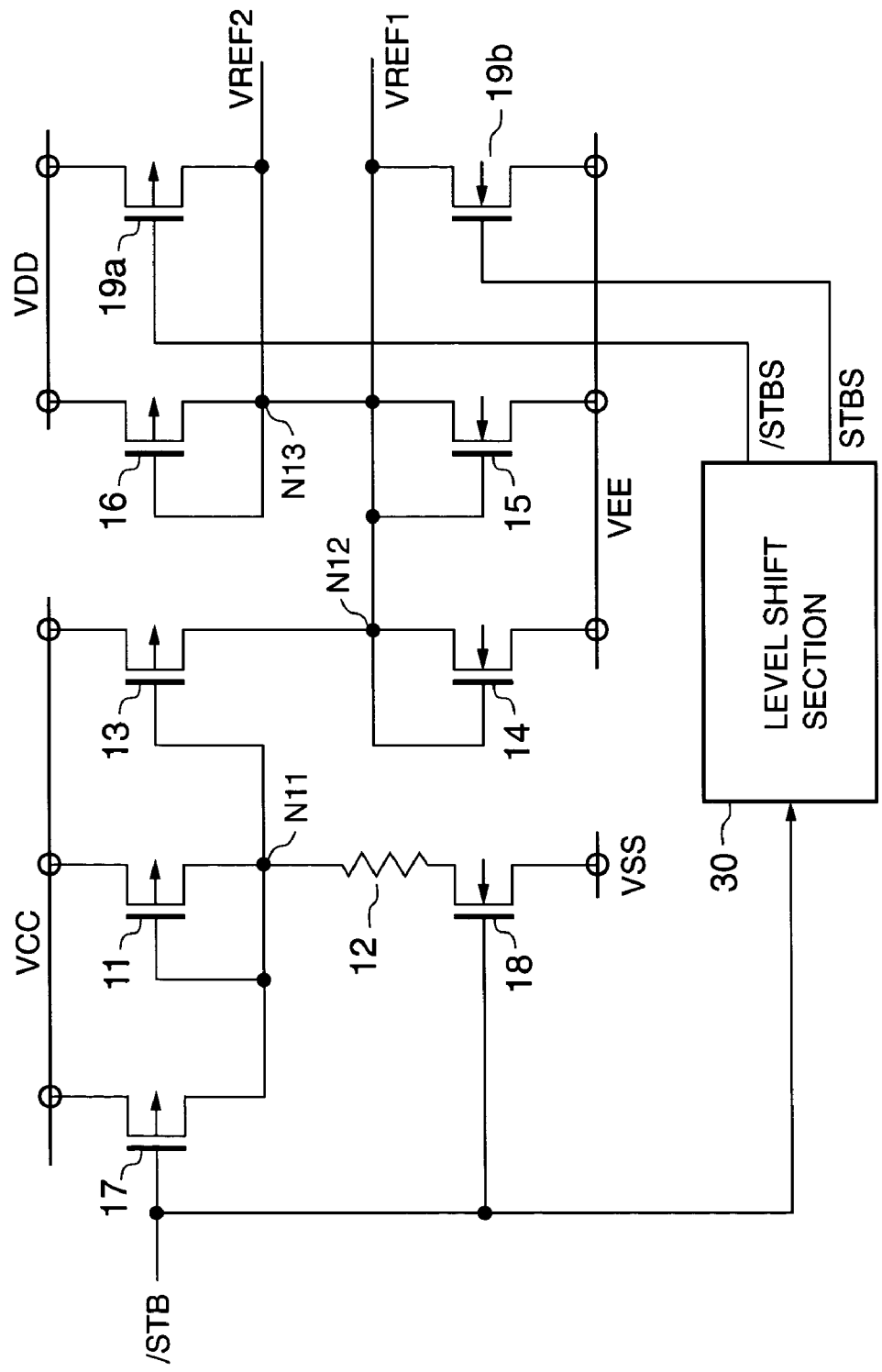
FIG. 2 is a configurational diagram of a reference voltage generator illustrating a first embodiment of the present invention.

FIG. 2 is a configuration diagram of a reference voltage generator showing a first embodiment of the present invention.

The reference voltage generator has a PMOS11 that generates a constant voltage. The source of the PMOS11 is connected to a potential VCC (e.g., +3V) and the gate and drain thereof are connected to a node N11. One end of a current-limiting resistor 12 is connected to the node N11, whereas the other end thereof is connected to a potential VSS (e.g., 0V) through an NMOS18.

The gate of a PMOS13, which constitutes a current mirror circuit with respect to the PMOS11, is connected to the node N11, whereas the source and drain of the PMOS13 are respectively connected to the potential VCC and a node N12. The drain and gate of an NMOS14 are connected to the node N12 and the source thereof is connected to a potential VEE (e.g., −15V).

Further, the gate of an NMOS15, which constitutes a current mirror circuit with respect to the NMOS14, is connected to the node N12. The source of the NMOS15 is connected to the potential VEE and the drain thereof is connected to a node N13. The gate and drain of a PMOS16 are connected to the node N13 and the source thereof is connected to a potential VDD (e.g., +15). Reference voltages VREF1 and VREF2 are respectively outputted from the nodes N12 and N13.

On the other hand, the reference voltage generator is configured so as to be able to stop its circuit operation in accordance with a standby signal /STB (where "/" indicates inverse logic). That is, the reference voltage generator has a PMOS17 of which the source is connected to the potential VCC and the drain is connected to the node N11. The standby signal /STB is supplied to the gates of the PMOS17 and the above-mentioned NMOS18. Further, a PMOS19a is connected between the potential VDD and the node N13, whereas an NMOS19b is connected between the node N12 and the potential VEE. The gates of the PMOS19a and NMOS19b are respectively supplied with standby signals /STBS and STBS from the level shift section 30.

Figure 3:
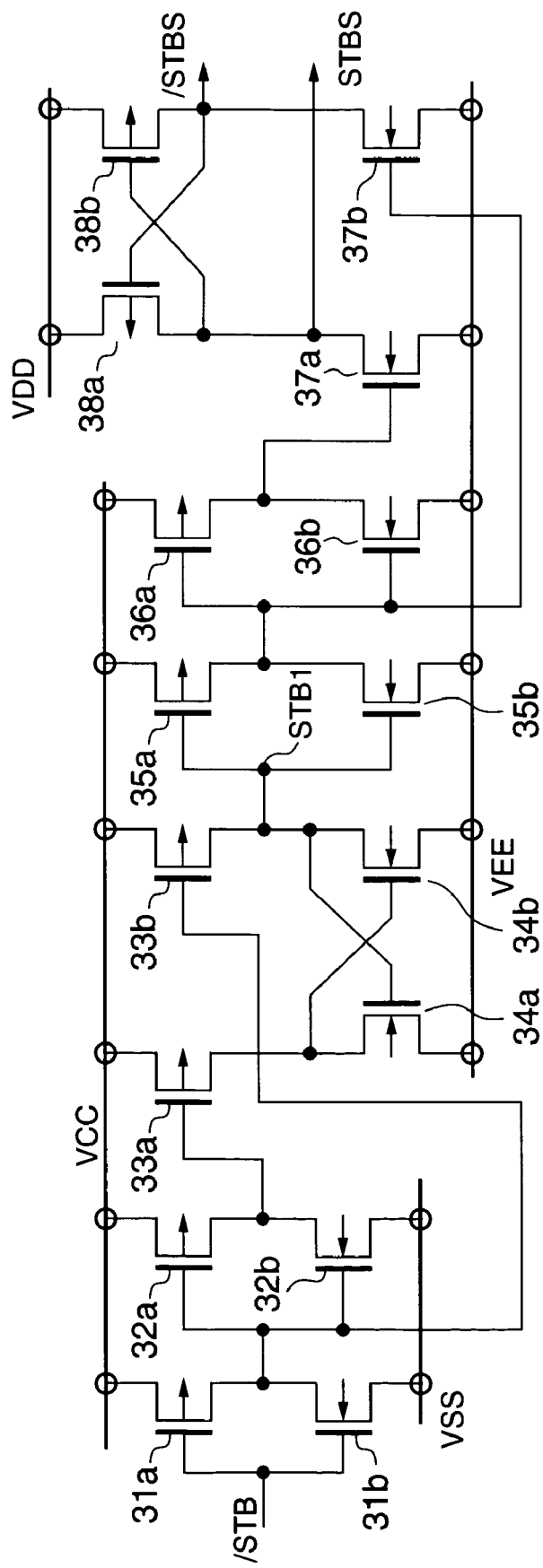
FIG. 3 is a circuit diagram showing one example of a level shift section 30 shown in FIG. 2.

FIG. 3 is a circuit diagram showing one example of the level shift section 30 shown in FIG. 2.

The level shift section 30 converts signal levels of potentials VCC and VSS each given as a standby signal /STB to generate complementary standby signals STBS and /STBS respectively having potentials VDD and VEE.

The level shift section 30 has an inverter 31 (PMOS31a and NMOS31b) and an inverter 32 (PMOS32a and NMOS32b) connected in tandem, for generating the complementary standby signals STB and /STB from the standby signal /STB. The output sides of the inverters 31 and 32 are respectively connected to a shift circuit made up of PMOSs 33a and 33b and NMOSs 34a and 34b, for converting the standby signals STB and /STB into signals of potential VCC and VEE levels.

The sources of the PMOSs 33a and 33b of the shift circuit are connected to the potential VCC and the output sides of the inverters 32 and 31 are respectively connected to the gates of these PMOSs 33a and 33b. The drain of the PMOS33a is connected to the drain of the NMOS34a and the gate of the NMOS34b. The drain of the PMOS33b is connected to the drain of the NMOS34b and the gate of the NMOS34a. The sources of the NMOSs 34a and 34b are connected to the potential VEE. A signal STBI having each of the potential VCC and VEE levels is outputted from the drain of the NMOS34b.

Further, the level shift circuit 30 has an inverter 35 (PMOS35a and NMOS35b) and an inverter 36 (PMOS36a and NMOS36b) connected in tandem, for generating complementary signals STBI and /STBI from the signal STBI. The output sides of the inverters 35 and 36 are respectively connected to a shift circuit made up of NMOSs 37a and 37b and PMOSs 38a and 38b, for generating standby signals STBS and /STBS having the final potential VCC and VEE levels.

The sources of the NMOSs 37a and 37b of the shift circuit are connected to the potential VEE and the output sides of the inverters 36 and 35 are respectively connected to the gates of these NMOSs 37a and 37b. The drain of the NMOS37a is connected to the drain of the PMOS38a and the gate of the PMOS38b. The drain of the NMOS37b is connected to the drain of the PMOS38b and the gate of the PMOS38a. The sources of the PMOSs 38a and 38b are connected to the potential VDD. The standby signals STBS and /STBS of potentials VDD and VEE levels are respectively outputted from the drains of the PMOS38a and PMOS38b.

The operation of the reference voltage generator will next be explained.

(1) When standby signal /STB is "L" (potential VSS) in level:

The PMOS17 is turned on and the NMOS18 is turned off so that no current flows through the resistor 12 and the node N11 is brought to the potential VCC. Thus, the NMOS11 and NMOS13 are turned off so that current between the potential VCC and the potentials VSS and VEE is cut off. The standby signals STBS and /STBS outputted from the level shift section 30 are respectively brought to levels "H" and "L". Thus, the PMOS19a and NMOS19b are both turned on so that the reference voltages VREF1 and VREF2 are respectively brought to the potentials VEE and VDD. Thus, the current between the potential VDD and the potential VEE is cut off.

(2) When standby signal /STB is "H" (potential VCC) in level:

When the standby signal /STB changes from "L" to "H", the PMOS17 is turned off and the NMOS18 is turned on. The standby signals STBS and /STBS outputted from the level shift section 30 are respectively brought to "L" and "H" and the PMOS19a and NMOS19b are both turned off.

With the turning on of the NMOS18, the node N11 is instantaneously pulled down to the potential VSS, so that the current begins to flow through the PMOS11. The potential of the node N11 rises and finally results in VCC−Vt assuming that the threshold voltage of the PMOS11 is Vt. At this time, the current that flows from the potential VCC to the potential VSS via the PMOS11, the resistor 12 and the NMOS18 results in a constant current limited by the resistor 12.

On the other hand, since the gate of the PMOS13 is connected to the node N11 and the current mirror circuit is constituted with respect to the PMOS11, the current that flows through the PMOS13 is determined by the ratio between dimensions (W/L) of the PMOS11 and PMOS13. That is, the current that flows from the potential VCC to the potential VEE via the PMOS13 and the NMOS14 is proportional to the current that flows through the PMOS11, regardless of the level of the potential VEE.

Since the gate and drain of the NMOS14 are connected to the node N12 together with the drain of the PMOS13, a reference voltage VREF1 (=VEE+Vtn) increased by a voltage Vtn (e.g., 1V) produced in the NMOS14 as viewed from the potential VEE is outputted to the node N12.

Further, since the gate of the NMOS15 is connected to the node N12 and the current mirror circuit is constituted with respect to the NMOS14, the current that flows through the NMOS15 is determined according to the ratio between dimensions of the NMOS14 and NMOS15. That is, the current that flows from the potential VDD to the potential VEE through the PMOS16 and the NMOS15 is proportional to the current that flows through the NMOS14, regardless of the level of the potential VDD.

Since the gate and drain of the PMOS16 are connected to the node N13 together with the drain of the NMOS15, a reference voltage VREF2 (=VDD−Vtp) reduced by a voltage Vtp (e.g., 1V) produced in the PMOS16 as viewed from the potential VDD is outputted to the node N13.

As described above, the reference voltage generator according to the first embodiment makes use of a voltage (VCC−VSS) lower than a normal power supply voltage (VDD−VEE) as the voltage to be applied to the current-limiting resistor 12 without using the normal power supply voltage (VDD−VEE). Therefore, even a low resistance value enables limitation of the current flowing through the resistor 12 to a sufficient small value.

Assuming that as illustrated by way of example, VDD=+15, VCC=+3V, VSS=0V and VEE=−15V, VCC−VSS=3V is obtained with respect to VDD−VEE=30V. It is therefore possible to set the resistance value of the resistor 12 to one-tenth the conventional one.

Assuming that the W/L of the PMOS11 is 20 μm/7 μm, the W/L of each of the PMOS13 and NMOS14 is 40 μm/7 μm, the W/L of the NMOS15 is 200 μm/7 μm, the W/L of the PMOS16 is 400 μm/7 μm and the W/L of each of the PMOS17, NMOS18, PMOS19a and NMOS19b is 10 μm/5 μm, and the value of the resistor 12 is 3MΩ, an approximate pattern area results in 19,000 μm$^2$ in total because a region for the resistor 12 becomes 200 μm×20 μm=4,000 μm$^2$, regions for the transistors become 200 μm×60 μm=12,000 μm$^2$, and a region for the level shift section 30 becomes 200 μm×15 μm. This is equivalent to 38% of the conventional area and hence 62% can be reduced in area.

Further, since the reference voltage generator according to the first embodiment is configured so as to be able to stop its circuit operation by the standby signal STB, current consumption in a standby state can further be reduced.

SECOND EMBODIMENT

Figure 4:
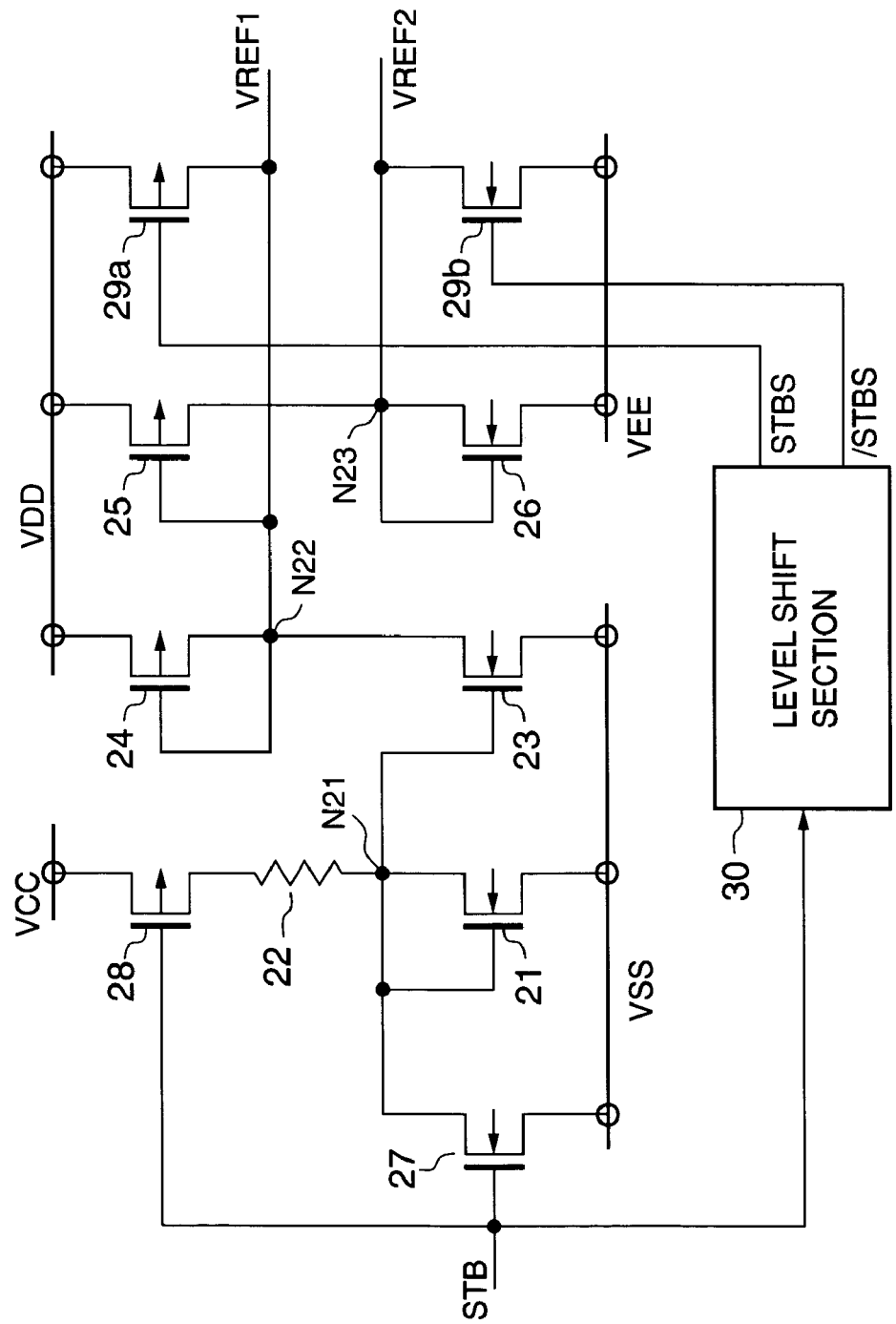
FIG. 4 is a configurational diagram of a reference voltage generator illustrating a second embodiment of the present invention.

FIG. 4 is a configurational diagram of a reference voltage generator showing a second embodiment of the present invention. The PMOSs and NMOSs shown in FIG. 2 have been interchanged with one another. With their interchange, the potentials VCC and VSS, and the potentials VDD and VEE are respectively interchanged with one another.

That is, the reference voltage generator has a constant-voltage generating NMOS21. The source of the NMOS21 is connected to the potential VSS and the gate and drain thereof are connected to a node N21. One end of a current-limiting resistor 22 is connected to the node N21 and the other end thereof is connected to the potential VCC via a PMOS28.

The gate of an NMOS23, which constitutes a current mirror circuit with respect to the NMOS21, is connected to the node N21. The source and drain of the NMOS23 are connected to their corresponding potential VSS and node N22. The drain and gate of a PMOS24 are connected to the node N22 and the source of the PMOS24 is connected to the potential VDD.

The gate of a PMOS25, which constitutes a current mirror circuit with respect to the PMOS24, is connected to the node N22. The source of the PMOS25 is connected to the potential VDD and the drain thereof is connected to a node N23. The drain and gate of an NMOS26 are connected to the node N23 and the source thereof is connected to the potential VEE. Reference voltages VREF1 and VREF2 are respectively outputted from the nodes N23 and N24.

On the other hand, the reference voltage generator is configured so as to be capable of stopping its circuit operation in accordance with a standby signal STB. That is, the reference voltage generator has an NMOS27 of which the source is connected to the potential VSS and the drain is connected to the node N21. The standby signal STB is supplied to the gates of the NMOS17 and the above-mentioned PMOS28. Further, a PMOS19a is connected between the potential VDD and the node N22, whereas an NMOS29b is connected between the node N23 and the potential VEE. The gates of the PMOS29a and NMOS29b are respectively supplied with standby signals STBS and /STBS from a level shift section 30 in a manner similar to FIG. 1.

A basic operation of the reference voltage generator is similar to the first embodiment shown in FIG. 2 and has a similar effect.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A reference voltage generator which generates bias reference voltages in a semiconductor integrated circuit connected to first and fourth potentials to operate, comprising:
a first conductivity type first transistor whose source is connected to a second potential between the first and fourth potentials and whose gate and drain are connected to a first node;
a current-limiting resistor having one end connected to a third potential between the second and fourth potentials and the other end connected to the first node;
a first conductivity type second transistor having a source connected to the second potential, a gate connected to the first node and a drain connected to a second node from which a first reference voltage is outputted;
a second conductivity type third transistor having a drain and gate connected to the second node and a source connected to the fourth potential;
a second conductivity type fourth transistor having a source connected to the fourth potential, a gate connected to the second node and a drain connected to a third node from which a second reference voltage is outputted; and
a first conductivity type fifth transistor having a source connected to the first potential and a gate and drain connected to the third node.

2. A reference voltage generator according to claim 1, further comprising:
a sixth transistor which short-circuits between the second potential and the first node when a standby signal is supplied,
a seventh transistor which opens between the resistor and the third potential when the standby signal is supplied,
an eighth transistor which short-circuits between the first potential and the third node when the standby signal is supplied; and
a ninth transistor which short-circuits between the fourth potential and the second node when the standby signal is supplied.

3. A reference voltage generator according to claim 2, wherein the standby signal is a signal that changes between the second potential and the third potential, and further including a level shift circuit which is inputted with the signal and outputs a level-shifted standby signal changed between the first potential and the fourth potential and an inverted signal thereof.

4. A reference voltage generator according to claim 3, wherein the level-shifted standby signal and the inverted signal thereof are inputted to the gates of the eighth and ninth transistors.

* * * * *